(12) United States Patent
Henry

(10) Patent No.: US 6,822,587 B2
(45) Date of Patent: Nov. 23, 2004

(54) DIGITAL SIGNAL CODING AND DECODING

(75) Inventor: Félix Henry, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/347,829

(22) Filed: Jan. 22, 2003

(65) Prior Publication Data

US 2003/0146859 A1 Aug. 7, 2003

(30) Foreign Application Priority Data

Feb. 4, 2002 (FR) .............................. 02 01277

(51) Int. Cl.$^7$ ................................ H03M 7/00
(52) U.S. Cl. ............................ 341/50; 341/51
(58) Field of Search .................... 341/50, 51, 67; 382/239, 240; 372/240.02

(56) References Cited

U.S. PATENT DOCUMENTS

| | | | |
|---|---|---|---|
| 5,500,678 A | 3/1996 | Puri | 348/408 |
| 6,215,422 B1 | 4/2001 | Henry et al. | 341/51 |
| 6,218,968 B1 * | 4/2001 | Smeets et al. | 341/65 |
| 6,263,026 B1 | 7/2001 | Je-Chang et al. | 375/240.23 |
| 6,333,705 B1 | 12/2001 | Amonou et al. | 341/107 |
| 6,501,860 B1 * | 12/2002 | Charrier et al. | 382/240 |

FOREIGN PATENT DOCUMENTS

| | | | |
|---|---|---|---|
| EP | 0580454 A2 | 1/1994 | H04N/7/13 |
| EP | 08 89960 A2 | 3/1999 | H04N/7/26 |
| FR | 97 10804 | 3/1999 | H04B/1/66 |
| FR | 99 04401 | 10/2000 | H04N/7/24 |

* cited by examiner

Primary Examiner—Brian Young
Assistant Examiner—Joseph Lauture
(74) Attorney, Agent, or Firm—Fitzpatrick, Cella, Harper & Scinto

(57) ABSTRACT

The invention concerns a method of coding a set of coefficients representing physical quantities. The method includes the step of selecting, for each coefficient to be coded, a first or second coding mode according to a coding cost, the first coding mode including the calculation of an amplitude model, and the determination of a path (P) amongst the coefficients. The method also includes the steps of coding the length of the path, coding the coefficients for which the first coding mode has been selected, by the first coding mode, and coding the coefficients for which the second coding mode has been selected, by the second coding mode.

25 Claims, 4 Drawing Sheets

DIGITAL SIGNAL CODING AND DECODING

FIELD OF THE INVENTION

The present invention concerns in general terms digital signal coding and proposes for this purpose a digital signal coding device and method. It also concerns a decoding method and device corresponding to the coding method and device.

The purpose of coding is to compress the signal, which makes it possible to transmit or respectively store the digital signal whilst reducing the transmission time or transmission rate or respectively reducing the memory space used.

The invention is situated in the field of the compression of digital signals with loss. The digital signals considered here are of any nature, for example fixed images, video, sound or computer data.

BACKGROUND OF THE INVENTION

Hereinafter, the coding and decoding of a fixed image is more particularly considered.

The French patent application No. 97 10804 filed by the applicant proposes to code a set of digital data according to several coding modes. Thus different parts of the data are coded according to different coding modes so as to obtain a good compression to distortion ratio. Additional data is joined to the coding data in order to indicate on which parts of the data set each coding mode is used. The additional data is used during the subsequent decoding. However, this additional data reduces the degree of compression.

French patent application No. 99 04401 filed by the applicant proposes to improve this technique, by not transmitting any additional data. The degree of compression is thus higher.

In this case, during decoding, all the possible decoding modes are tested on each part of the data set and the most likely mode is adopted. This technique has the drawback that errors in the choice of the decoding mode may occur during decoding. These errors then give rise to distortion on the decoded data.

SUMMARY OF THE INVENTION

The present invention aims to remedy the drawbacks of the prior art, by providing a coding method and device which use two coding modes for different parts of the data to be coded, whilst not requiring any additional information for indicating the coding mode used on each part.

To this end, the invention proposes a method of coding a set of coefficients representing physical quantities, characterized in that it includes the steps of:

selecting, for each coefficient to be coded, a first or second coding mode according to a coding cost, the first coding mode including the calculation of an amplitude model, and the determination of a path amongst the coefficients, coding the length of the path, coding the coefficients for which the first coding mode has been selected, by the first coding mode, coding the coefficients for which the second coding mode has been selected, by the second coding mode.

The invention thus affords a good compression to distortion ratio, since different parts of the signal are coded according to a coding mode which minimizes the coding cost. Moreover, no additional information is necessary for indicating which coding mode is used on which part of the signal. During the subsequent decoding, there is no risk of error in the choice of the decoding mode to be used.

According to a preferred characteristic, the data set is a block of data formed in a larger data set. Processing by block makes it possible to limit the memory size necessary for the calculations.

According to another preferred characteristic, the data set is a set previously transformed by a discrete cosine or discrete wavelet transformation.

According to a preferred characteristic, the coding cost includes the transmission rate of the data coded according to the first coding mode. Thus the coding mode is chosen according to the transmission rate of the coded data.

According to a preferred characteristic, the coding cost includes the distortion of the data coded according to the first coding mode. Thus the coding mode is chosen according to the distortion caused by the coding.

Naturally, the coding mode can be chosen according to a combination of the transmission rate and distortion.

According to a preferred characteristic, the second coding mode is JPEG coding. This coding mode is commonly used for coding fixed images.

According to a preferred characteristic, the method also includes the steps of:

calculating the coding cost of the coefficients of the path by the second coding mode, coding the set of coefficients according to the second coding mode if the coding cost by the second coding mode is less than the coding cost by the first coding mode, on the path.

This case corresponds to the limit case in which the path has zero length.

The invention also relates to a method of decoding a data set previously coded by the method previously presented, characterized in that it includes the steps of:

decoding the length of the path, decoding the coefficients belonging to the path, according to a first decoding mode, decoding the other coefficients according to a second decoding mode.

The decoding method first of all makes it possible to determine the number of coefficients which have been coded according to the first coding mode, then to decode these coefficients and finally to decode the other coefficients according to the second decoding mode.

Correlatively, the invention concerns a device for coding a set of coefficients representing physical quantities, characterized in that it has:

means for selecting, for each coefficient to be coded, a first or second coding mode according to a coding cost, the first coding mode including the calculation of an amplitude model, and the determination of a path amongst the coefficients, means for coding the length of the path, means for coding the coefficients for which the first coding mode has been selected, by the first coding mode, means for coding the coefficients for which the second coding mode has been selected, by the second coding mode.

The coding device has means for implementing the previously presented coding characteristics.

The invention also concerns a device for decoding a data set previously coded by the device presented above, characterized in that it has:

means for decoding the length of the path,
means for decoding the coefficients belonging to the path, according to a first decoding mode,
means for decoding the other coefficients according to a second decoding mode.

The decoding device has means for implementing the decoding characteristics previously presented.

The coding device and the decoding method and device have advantages similar to those presented above.

The invention also concerns a digital apparatus including the device according to the invention, or means for implementing the method according to the invention. This digital apparatus is for example a digital photographic apparatus, a digital camcorder, a scanner, a printer, a photocopier or a facsimile machine. The advantages of the device and of the digital apparatus are identical to those set out above.

The invention also concerns an information storage means which can be read by a computer or by a microprocessor, integrated or not into the device, possibly removable, storing a program implementing the methods according to the invention.

The invention also concerns a computer program which can be read by a microprocessor and containing one or more sequences of instructions which is able to implement the methods according to the invention.

BRIEF DESCRIPTION OF THE DRAWINGS

The characteristics and advantages of the present invention will be clarified with reference to a preferred embodiment illustrated by the accompanying drawings, in which.

DETAILED DESCRIPTION OF THE PREFERRED EMBODIMENTS

Figure 1:
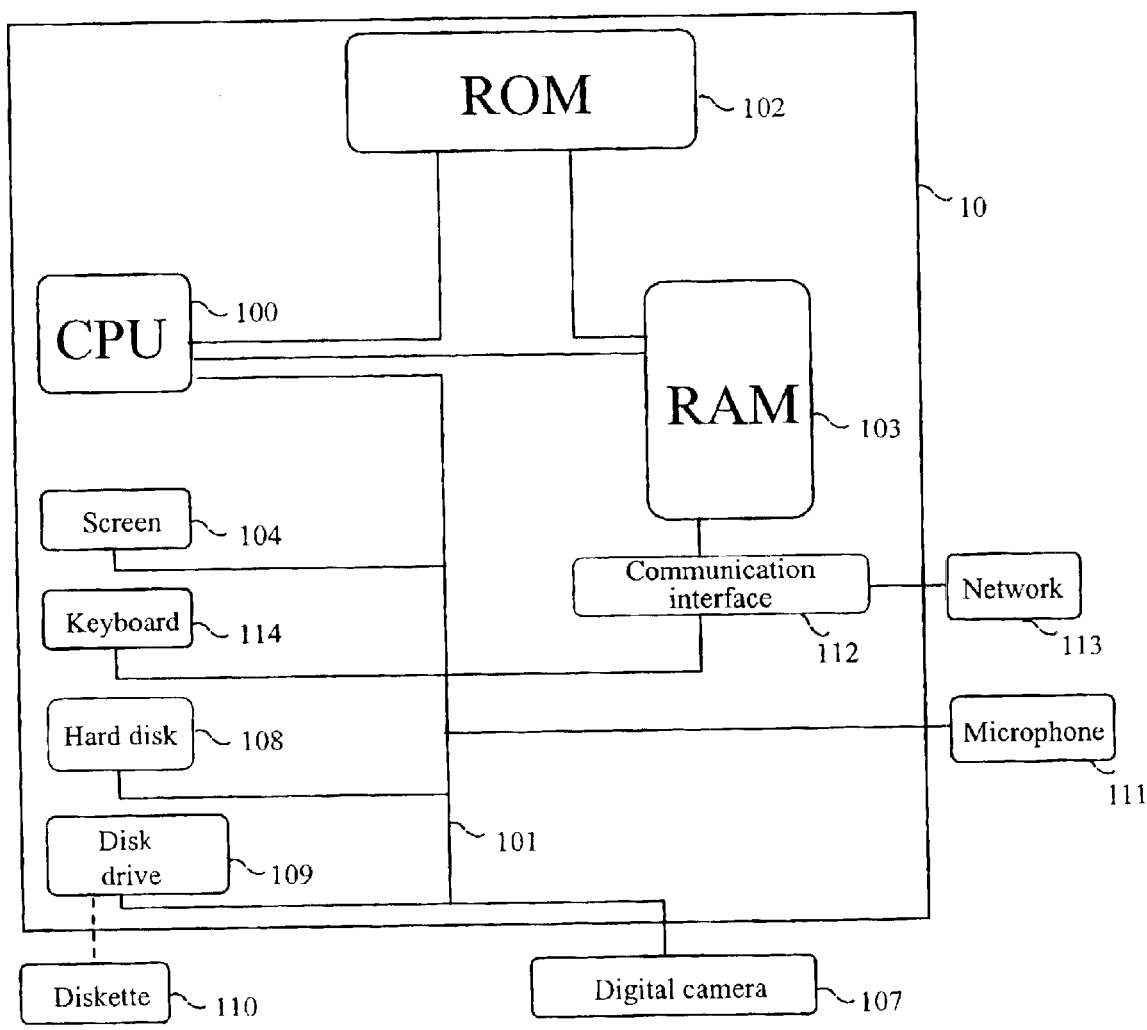
FIG. 1 is an embodiment of a device implementing the invention.

According to the chosen embodiment depicted in FIG. 1, a device implementing the invention is for example a microcomputer 10 connected to various peripherals, for example a digital camera 107 (or a scanner, or any image acquisition or storage means) connected to a graphics card and supplying information to be processed according to the invention.

The device 10 has a communication interface 112 connected to a network 113 able to transmit digital data to be processed or conversely to transmit data processed by the device. The device 10 also has a storage means 108 such as for example a hard disk. It also has a drive 109 for a disk 110. This disk 110 can be a diskette, a CD-ROM or a DVD-ROM for example. The disk 110, like the disk 108, can contain data processed according to the invention as well as the program or programs implementing the invention which, once read by the device 10, will be stored in the hard disk 108. According to a variant, the program enabling the device to implement the invention can be stored in read only memory 102 (referred to as ROM in the drawing). In a second variant, the program can be received and stored in an identical fashion to that described previously by means of the communication network 113.

The device 10 is connected to a microphone 111. The data to be processed according to the invention will in this case be of the audio signal.

This same device has a screen 104 for displaying the data to be processed or serving as an interface with the user, who can thus parameterize certain processing modes, using the keyboard 114 or any other means (a mouse for example).

The central unit 100 (referred to as CPU in the drawing) executes the instructions relating to the implementation of the invention, instructions stored in the read only memory 102 or in the other storage elements. On powering up, the processing programs stored in a non-volatile memory, for example the ROM 102, are transferred into the random access memory RAM 103, which will then contain the executable code of the invention as well as registers for storing the variables necessary for implementing the invention.

In more general terms, an information storage means which can be read by a computer or by a microprocessor, integrated or not into the device, possibly removable, stores a program implementing the method according to the invention.

The communication bus 101 affords communication between the different elements included in the microcomputer 10 or connected to it. The representation of the bus 101 is not limitative and notably the central unit 100 is able to communicate instructions to any element of the microcomputer 10 directly or by means of another element of the microcomputer 10.

Figure 2:
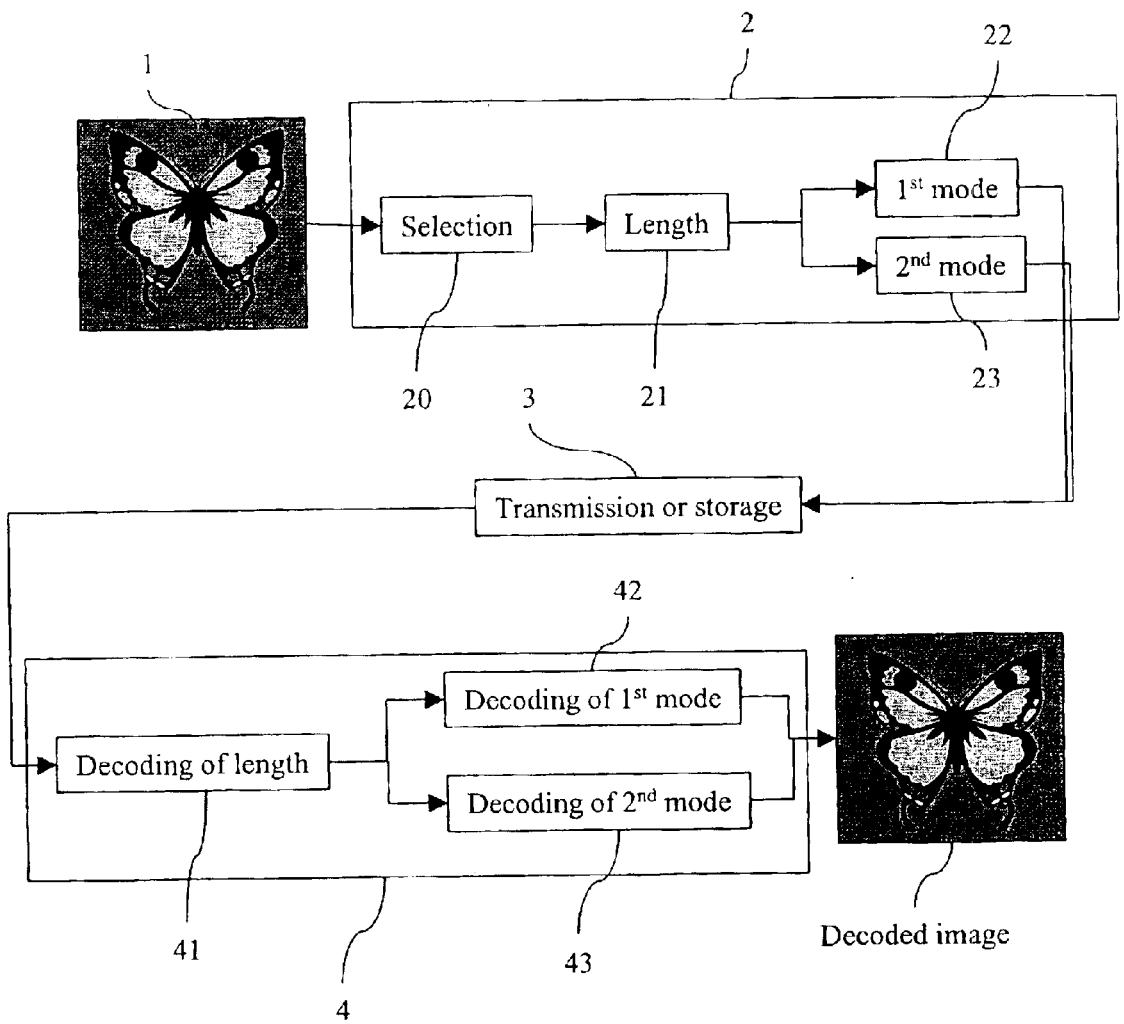
FIG. 2 depicts a coding device according to the invention and a corresponding decoding device.

With reference to FIG. 2, an embodiment of a coding device 2 according to the invention is intended to code a digital signal for the purpose of compressing it. The coding device is integrated into an apparatus, which is for example a digital photographic apparatus, a digital camcorder, a scanner, a printer, a photocopier, a facsimile machine, a database management system or a computer.

An image source 1 supplies a digital image to the coding device 2, whose functioning will be detailed below.

The coding device 2 has:

means 20 for selecting, for each coefficient to be coded, a first or second coding mode according to a coding cost, the first coding mode including the calculation of an amplitude model, and the determination of a path amongst the coefficients, means 21 for coding the length of the path, means 22 for coding the coefficients for which the first coding mode has been selected, by the first coding mode, means 23 for coding the coefficients for which the second coding mode has been selected, by the second coding mode.

The coding device also has:

means 20 for calculating the coding cost of the coefficients of the path by the second coding mode, means 23 for coding the set of coefficients according to the second coding mode if the coding cost by the second coding mode is less than the coding cost by the first coding mode, on the path. In this case, the length of the path is zero.

The coding device supplies a file containing data representing the compressed image to transmission and/or storage means 3. These means are conventional and will not be described here.

The means 3 are connected to a decoding device 4 whose functioning will be detailed below.

The decoding device has:

means 41 for decoding the length of the path, means 42 for decoding the coefficients belonging to the path, according to a first decoding mode, means 43 for decoding the other coefficients according to a second decoding mode.

It should be noted that the coding device and decoding device can be integrated in the same apparatus, for example the computer 10 of FIG. 1.

Figure 3:
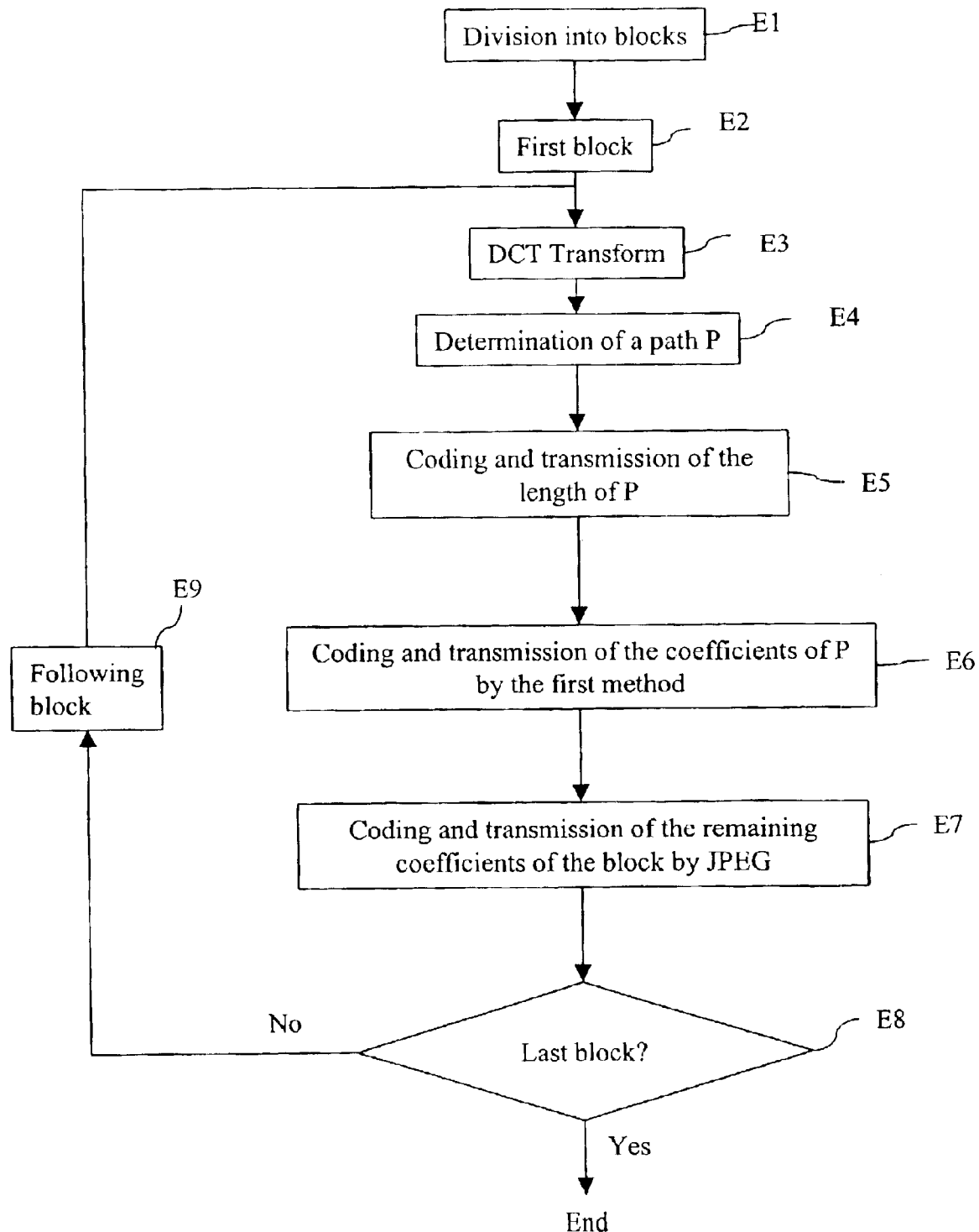
FIG. 3 is an embodiment of the coding method according to the invention.

FIG. 3 depicts an embodiment of a method of coding an image according to the invention. This method is implemented in the coding device and includes steps E1 to E9.

The method is implemented in the form of an algorithm which can be stored in whole or in part in any information storage means capable of cooperating with the microprocessor. This storage means can be read by a computer or by a microprocessor. This storage means is integrated or not into the device, and may be removable. For example, it may contain a magnetic tape, a diskette or a CD-ROM (fixed-memory compact disk).

Step E1 is a division of the image to be coded into blocks. In general terms, a block is a set of samples of the image. For example, adjacent square blocks of a predetermined size 8×8 pixels are formed in the image.

The following step E2 is the selection of a first block in the image.

The following step E3 is a linear or non-linear transformation of the image. For example, a discrete cosine transformation, referred to as DCT from the English Discrete Cosine Transform, is applied to the image. As a variant, a discrete wavelet transformation is applied to the image.

The following step E4 is the determination of a path P amongst the coefficients of the current block.

A first coding mode is considered here which uses an established path amongst a set of digital samples. For example, the French patent applications 01 06933 and 01 13922 concern such coding modes.

Thus, according to this coding mode, the coded form of a block includes an amplitude model which supplies an approximation of the amplitude of the coefficients and a path which supplies an ordered sequence of the locations of the coefficients. The location of the $k^{th}$ coefficient of this series is determined by the path and its amplitude is determined by the ordinate corresponding to the abscissa k according to the amplitude model.

The path includes a coefficient of the sub-band, referred to as the initial coefficient, and a list of vectors joining at least some of the other coefficients.

The path is determined so as to minimize a coding cost on the block taken as a whole. The coding cost represents a compromise between transmission rate and distortion. The coding cost of a signal S is the function $C(S)=R(S)+\lambda.D(S)$, in which R(S) represents the transmission rate of the coded form of the signal S, D(S) represents the distortion generated in the reconstructed signal after coding and decoding, compared with the original signal, and $\lambda$ is a parameter of adjustment between compression and distortion.

It should be noted that the minimization of the function C(S) on the signal S is equivalent to the minimization of the function C(S) on each element of a partitioning of the signal, in particular on each sample of the signal. This is due to the fact that the distortion and transmission rate are respectively additive.

Step E4 is followed by step E5, at which the length of the path, that is to say the number N of coefficients which form part of the path, is written in the compressed file in the form of a binary code.

The following step E6 is the coding of the N coefficients of the path P according to the previously described coding mode. Only the coefficients belonging to the path are coded at this step. The coding data is transmitted to a destination and/or stored.

The following step E7 is the coding of the coefficients which do not belong to the path P. These coefficients are coded according to the JPEG mode. The coefficients are coded in the conventional coding order defined by the JPEG standard. By running through the coefficients in this order, when a coefficient of the path P is encountered, it is not taken into account at this step and the following coefficient is considered. The coding data is transmitted to a destination and/or stored. In the limit case where the length of the path is zero, all the coefficients in the current block are coded according to the JPEG mode.

It should be noted that it is not necessary to indicate which coefficient is coded by which coding mode. This is because the length of the path is written in the compressed file and the coefficients of the path are coded and written in the compressed file before the coefficients coded according to the JPEG mode. Thus, on decoding, the number of coefficients of the path is known.

Step E7 is followed by step E8 which is a test for determining whether the current block is the last block to be processed. If the response is negative, then this step is followed by step E9, at which a following block is considered. Step E9 is followed by the previously described step E3.

When all the blocks have been processed, the coding of the image is ended.

Figure 4:
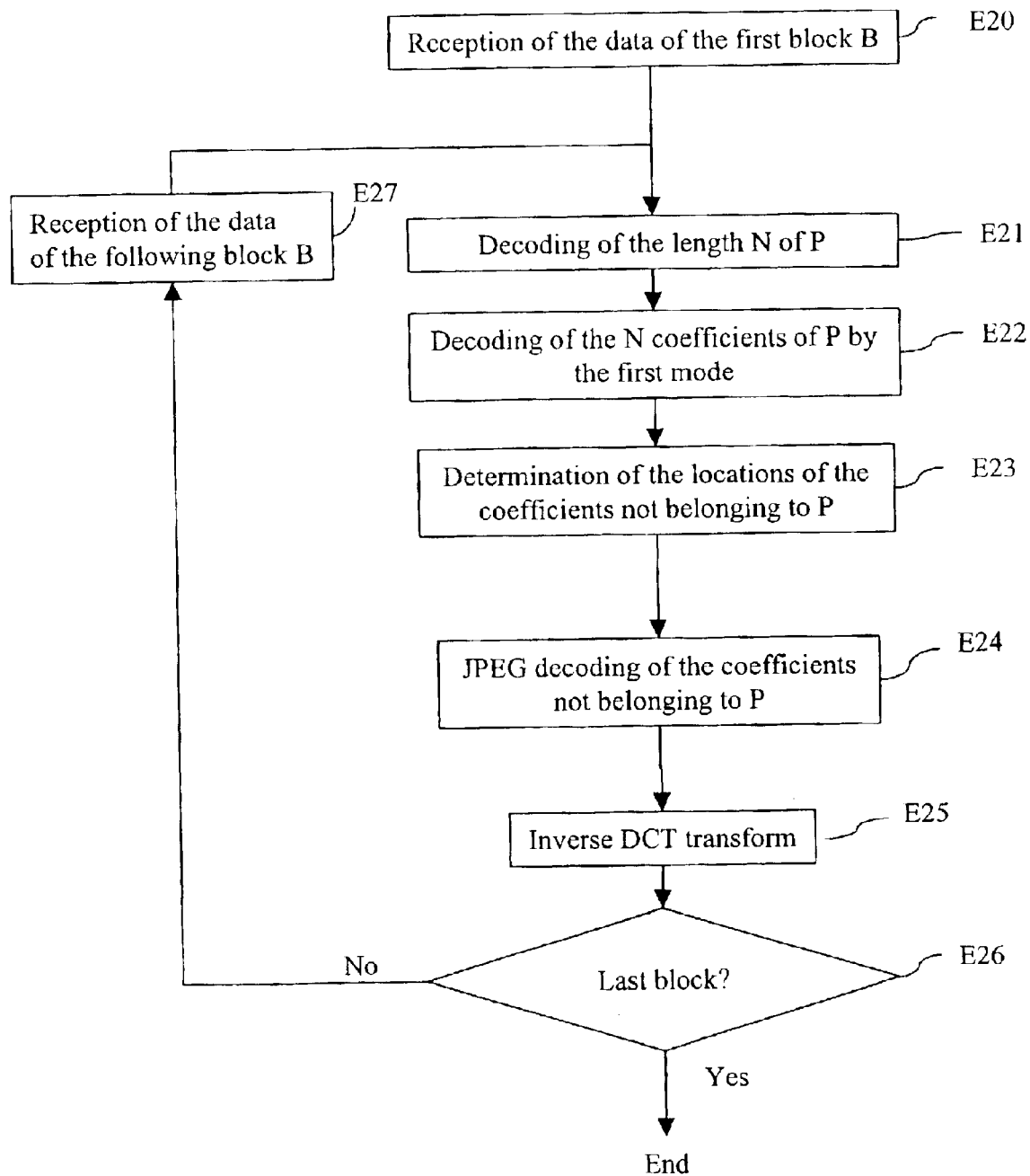
FIG. 4 is an embodiment of a decoding method according to the invention.

FIG. 4 depicts an embodiment of a method of decoding data 16, previously coded according to the method of FIG. 3.

This method is implemented in the decoding device and includes steps E20 to E27.

The method is implemented in the form of an algorithm, which can be stored in whole or in part in any information storage means capable of cooperating with the microprocessor. This storage means can be read by a computer or by a microprocessor. This storage means is integrated or not into the device, and may be removable. For example, it may include a magnetic tape, a diskette or a CD-ROM (fixed-memory compact disk).

Step E20 is the reception and/or reading in memory of the coding data of the first block.

At step E21, the length of the path P is read. The number N of coefficients of the path is thus known.

The following step E22 is a decoding of the N coefficients of the path. Their coding data is found in the compressed file because of the fact that they were written therein before the JPEG coding data of the other coefficients. This decoding is carried out as disclosed in the French patent application No. 01 06933.

The amplitude model is read and decoded, in order to supply the amplitudes of the coefficients. The path is read and decoded in order to supply the locations of the coefficients. The order of each coefficient of the path determines its amplitude, since the $k^{th}$ coefficient of the path receives the amplitude A(k) corresponding to the abscissa k according to the amplitude model.

The following step E23 is the determination of the locations of the coefficients which do not belong to the path P. For example, a list contains all the locations of the coefficients of the current block. As the coefficients of the path P are decoded (step E22), the coefficients of the path are removed from this list. At the end of the decoding of the coefficients of the path P, the list now contains only the coefficients which are to be decoded according to the JPEG decoding mode.

The following step E24 is the decoding of the coefficients which do not belong to the path P, according to a JPEG decoding mode. The coefficients are run through in a conventional order, but the coefficients belonging to the path P are not considered here. In the limit case where the length of the path is zero, all the coefficients are decoded according to the JPEG mode.

Step E24 is followed by step E25, at which an inverse DCT transformation is applied to the current decoded block.

The following step E26 is a test for determining whether the current block is the last block of the image to be processed. If the response is negative, then this step is followed by step E27, at which a following block is received and/or read in a memory. Step E27 is followed by the previously described step E21.

When the response is positive at step E26, then the image has been entirely decoded.

Naturally, the present invention is in no way limited to the embodiments described and depicted, but quite the contrary encompasses any variant within the capability of a person skilled in the art.

What is claimed is:

1. Method of coding a set of coefficients representing physical quantities, characterized in that it includes the steps of:

selecting (E4), for each coefficient to be coded, a first or second coding mode according to a coding cost, the first coding mode including the calculation of an amplitude model, and the determination of a path (P) amongst the coefficients, coding (E5) the length of the path, coding (E6) the coefficients for which the first coding mode has been selected, by the first coding mode, coding (E7) the coefficients for which the second coding mode has been selected, by the second coding mode.

2. Method according to claim 1, characterized in that the data set is a block of data formed (E1) in a larger data set.

3. Method according to claim 1 or 2, characterized in that the data set is a set previously transformed (E3) by a discrete cosine or discrete wavelet transformation.

4. Method according to claim 1 or 2, characterized in that the coding cost includes the transmission rate of the data coded according to the first coding mode.

5. Method according to claim 1 or 2, characterized in that the coding cost includes the distortion of the data coded according to the first coding mode.

6. Method according to claim 1 or 2, characterized in that the second coding mode is JPEG coding.

7. Method according to claim 1 or 2, characterized in that it also includes the steps of:

calculating (E6) the coding cost of the coefficients of the path by the second coding mode, coding (E6) the set of coefficients according to the second coding mode if the coding cost by the second coding mode is less than the coding cost by the first coding mode, on the path.

8. Method of decoding a data set previously coded by the method according to claim 1 or 2, characterized in that it includes the steps of:

decoding (E21) the length (N) of the path, decoding (E22) the coefficients belonging to the path, according to a first decoding mode, decoding (E24) the other coefficients according to a second decoding mode.

9. Computer program on a storage medium and comprising computer executable instructions for causing a computer to decode a set of coefficients according to claim 8.

10. Apparatus (10) for processing a digital image, characterized in that it has means adapted to implement the method according to claim 1 or 2.

11. Storage medium storing a program for implementing the method according to claim 1 or 2.

12. Storage medium according to claim 11, characterised in that said storage medium is a floppy disk or a CD-ROM.

13. Computer program on a storage medium and comprising computer executable instructions for causing a computer to code a set of coefficients according to claim 1 or 2.

14. Device for coding a set of coefficients representing physical quantities, characterized in that it has:

means (20) for selecting, for each coefficient to be coded, a first or second coding mode according to a coding cost, the first coding mode including the calculation of an amplitude model, and the determination of a path amongst the coefficients, means (21) for coding the length of the path, means (22) for coding the coefficients for which the first coding mode has been selected, by the first coding mode, means (23) for coding the coefficients for which the second coding mode has been selected, by the second coding mode.

15. Device according to claim 14, characterized in that it is adapted to consider a data set which is a block of data formed in a larger data set.

16. Device according to claim 14 or 15, characterized in that it has means for first transforming the data set by means of a discrete cosine or discrete wavelet transformation.

17. Device according to claim 14 or 15, characterized in that the selection means (20) are adapted to consider a coding cost which includes the transmission rate of the data coded according to the first coding mode.

18. Device according to claim 14 or 15, characterized in that the selection means (20) are adapted to consider a coding cost which includes the distortion of the data coded according to the first coding mode.

19. Device according to claim 14 or 15, characterized in that the coding means (22) are adapted to affect a second coding mode which is JPEG coding.

20. Device according to claim 14 or 15, characterized in that it also has:

means (20) for calculating the coding cost of the coefficients of the path by the second coding mode, means (22) for coding the set of coefficients according to the second coding mode if the coding cost by the second coding mode is less than the coding cost by the first coding mode, on the path.

21. Coding device according to claim 14 or 15, characterized in that the selection and coding means are incorporated in:

a microprocessor (100), a read only memory (102) containing a program for processing the data, and a random access memory (103) containing registers adapted to record variables modified during the execution of said program.

22. Apparatus (10) for processing a digital image, characterized in that it includes the device according to claim 14 or 15.

23. Device for decoding a data set previously coded by the device according to claim 14, or 15, characterized in that it has:

means (41) for decoding the length (N) of the path, means (42) for decoding the coefficients belonging to the path, according to a first decoding mode, means (43) for decoding the other coefficients according to a second decoding mode.

24. Decoding device according to claim 23, characterized in that the decoding means are incorporated in:

a microprocessor (100), a read only memory (102) containing a program for processing the data, and a random access memory (103) containing registers adapted to record variables modified during the execution of said program.

25. Storage medium storing a program for implementing a method of coding a set of coefficients representing physical quantities, the method characterized in that it includes the steps of:

selecting (E4), for each coefficient to be coded, a first or second coding mode according to a coding cost, the first coding mode including the calculation of an amplitude model, and the determination of a path (P) amongst the coefficients, coding (E5) the length of the path, coding (E6) the coefficients for which the first coding mode has been selected, by the first coding mode, coding (E7) the coefficients for which the second coding mode has been selected, by the second coding mode, wherein said storage medium is detachably mountable on a device according to claims 14 or 15.

* * * * *